United States Patent [19]
Ker et al.

[11] Patent Number: 6,008,684
[45] Date of Patent: Dec. 28, 1999

[54] CMOS OUTPUT BUFFER WITH CMOS-CONTROLLED LATERAL SCR DEVICES

[75] Inventors: Ming-Dou Ker, Hsinchu; Hun-Hsien Chang, Taipei, both of Taiwan

[73] Assignee: Industrial Technology Research Institute, Taiwan

[21] Appl. No.: 08/735,894

[22] Filed: Oct. 23, 1996

[51] Int. Cl.[6] .............................................. H03K 17/687
[52] U.S. Cl. .......................... 327/428; 327/108; 327/109; 327/330
[58] Field of Search .................. 327/108, 109, 327/428, 330

[56] References Cited

U.S. PATENT DOCUMENTS

| | | | |
|---|---|---|---|
| 4,551,643 | 11/1985 | Russell et al. | 327/428 |
| 4,638,187 | 1/1987 | Boler et al. | 307/451 |
| 4,825,101 | 4/1989 | Walters, Jr. | 307/270 |
| 5,189,319 | 2/1993 | Fung et al. | 307/452 |
| 5,255,146 | 10/1993 | Miller | 361/56 |
| 5,367,205 | 11/1994 | Powell | 326/27 |
| 5,391,939 | 2/1995 | Nonaka | 326/83 |
| 5,430,595 | 7/1995 | Wagner et al. | 327/304 |
| 5,440,162 | 8/1995 | Worley et al. | 257/355 |
| 5,444,397 | 8/1995 | Wong et al. | 327/57 |

FOREIGN PATENT DOCUMENTS

| | | | |
|---|---|---|---|
| 57-103488 | 6/1982 | Japan | 327/428 |

OTHER PUBLICATIONS

Worley, et al., "Sub–Micron Chip ESD Protection Schemes which Avoid Avalanching Junctions," *EOS/ESD Symposium*, 95–13–95–20, (1995).

Merrill, et al, "ESD Design Methodology," *EOS/ESD Symposium*, 93–233–93–237, (1993).

Chatterjee, et al, "A Low–Voltage Triggering SCR for On–Chip ESD Protection at Output and Input Pads," *IEEE Electron Device Letters*, vol. 12:21–22 (Jan. 1991).

Ker, et al., "Area–Efficient CMOS Output Buffer with Enhanced High ESD Reliability for Deep Submicron CMOS ASIC," *IEEE*, 123–126 (Jan. 1995).

Ker, et al., ESD Protection for Deep–Submicron CMOS Technology Using Gate–Couple CMOS–Trigger Lateral Structure, *IEEE*, 21.2.1–21.2.4 (1995).

*Primary Examiner*—Margaret R. Wambach
*Attorney, Agent, or Firm*—Fish & Richardson P.C.

[57] ABSTRACT

An MOS-controlled, lateral SCR device including a semiconductor substrate of a first doping type; a first well region formed in the substrate and being of a second doping type which is different from the first doping type; a second well region formed in the substrate, being of the second doping type, and being spaced apart from the first well region so as to define an intermediate region separating the first and second well regions from each other; a first region formed within the first well region and extending into the intermediate region between the first and second well regions, the first region being of the second doping type; a second region formed within the second well region and extending into the intermediate region between the first and second well regions, the second region being of the second doping type; and a control gate bridging over the intermediate region between the first and second regions.

16 Claims, 12 Drawing Sheets

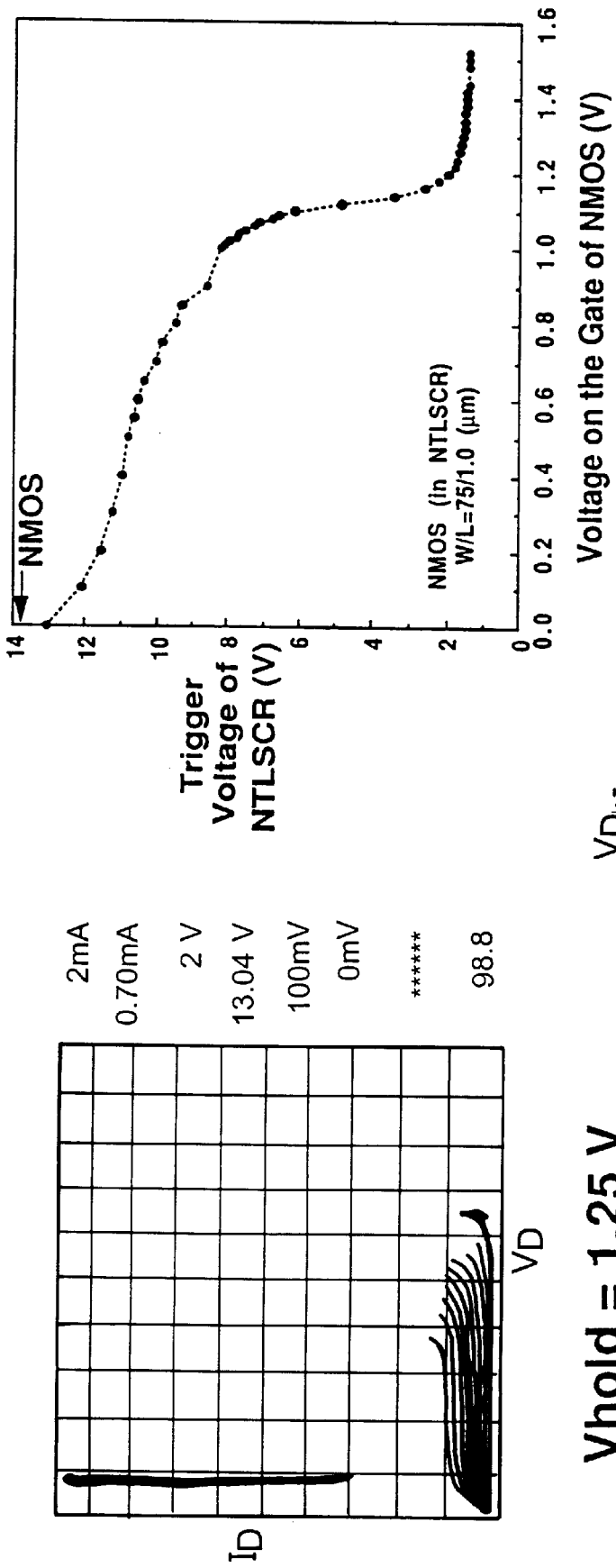
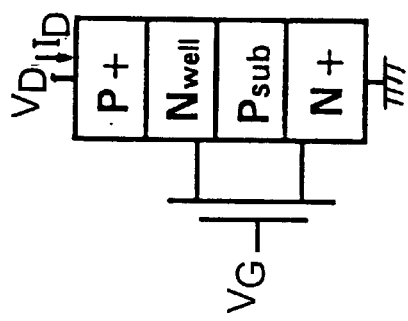
FIG. 5B
FIG. 5A
Vhold = 1.25 V
Ihold = 6.18 mA $V_{hold} = -1.45\ V$
$I_{hold} = -10.2\ mA$

CMOS OUTPUT BUFFER WITH CMOS-CONTROLLED LATERAL SCR DEVICES

BACKGROUND OF THE INVENTION

The invention relates generally to a CMOS output buffer.

In CMOS IC's, an output buffer generally has a pull-up device to pull up the voltage on its output node and a pull-down device to pull down the output voltage on its output node. In digital circuits, the pull-up output voltage is near VDD, and the pull-down output voltage is near VSS. There are several patents relating to output buffer design, including for example: U.S. Pat. No. 5,391,939, entitled "Output Circuit of a Semiconductor Integrated Circuit"; U.S. Pat. No. 4,638,187, entitled "CMOS Output Buffer Providing High Drive Current with Minimum Output Signal Distortion"; U.S. Pat. No. 4,825,101, entitled "Full-Level Fast CMOS Output Buffer"; U.S. Pat. No. 5,189,319, entitled "Power Reducing Buffer/Latch Circuits"; and U.S. Pat. No. 5,367,205, entitled "High Speed Output Buffer with Reduced Voltage Bounce and No Cross Current".

Several conventional CMOS output buffers are shown in FIGS. 1(a–c). In FIG. 1(a), a commonly-used CMOS output buffer configuration includes a PMOS device as a pull-up transistor and an NMOS device as a pull-down transistor. The turn-on and turn-off behavior of output buffer is controlled by a prebuffer (i.e., control circuit). The prebuffer is also used to control the operational characteristics of the output buffer, e.g. producing a high-impedance state, low di/dt current, or some other special functional characteristics.

To handle the high driving or sinking currents, the output PMOS and NMOS transistors must be designed with large device dimensions and this causes the turn-on and the turn-off of the output PMOS or NMOS transistors to become very slow. Referring to FIG. 1(b), to solve this problem transient-handling circuits are added to the output buffer to improve its pull-up and pull-down operating speed. The transient-handling circuits only work within a short time duration when the output level has to be changed rapidly. The transient-handling circuits deliver the required high transient currents from either VDD or from VSS to the output node.

Alternatively, in circuits with particularly large device dimensions, complex prebuffer circuits are utilized to control the output buffer. For example, in high-speed applications, a CMOS tape buffer, such as is shown in FIG. 1(c), has been used so as to quickly drive the output buffer on or off. Even larger device dimensions of the CMOS output buffer results in having to use larger tape buffers, which in turn requires much more circuit layout area to achieve the required output functions.

In these circuits, the drains of the output PMOS and NMOS transistors are directly connected to the output pad, which is bonded to the pin of IC package. If the IC experiences an ESD (Electrostatic Discharge) event, the ESD voltage could easy cause damage to the output buffer. In submicron or deep-submicron CMOS processes, an LDD (lightly-doped drain) structure is used to overcome the hot-carrier phenomenon and a silicided diffusion is used to reduce sheet resistance of the MOS devices. But using these two advanced fabrication process techniques considerably degrades the robustness of the ESD protection of CMOS output buffer. Thus, even if the output buffer has much larger device dimensions, as a result of using these advanced CMOS processes, it is still very vulnerable to ESD stress.

Several papers have been published regarding the degradation on ESD protection reliability of CMOS IC's due to using the advanced fabrication processes. Among these papers are the following:

C. Duvvury and A. Amerasekara, "ESD: A pervasive reliability concern for IC technologies," in *Proc. of IEEE*, vol. 81, no. 5. pp. 690–702, May 1993.

A. Amerasekara and C. Duvvury, "The impact of technology scaling on ESD robustness and protection circuit design," 1994 *EOS/ESD Symp. Proc.*, EOS-16, pp. 237–245.

C. Duvvury, et al., "ESD protection in 1-um CMOS technologies," *Proc. of IRPS*, pp. 190–205, 1986.

C. Duvvury, et al., "ESD phenomena and protection issues in CMOS output buffer," *Proc. of IRPS*, pp. 174–180, 1987.

C. Duvvury and R. N. Rountree, "Output ESD protection techniques for advanced CMOS process," *EOS/ESD Symp. Proc.*, pp. 206–211, 1988.

C. Duvvury and C. Diaz, "Dynamic gate coupling of NMOS for efficient output ESD protection," *Proc. of IRPS*, pp. 141–150, 1992.

Because it is difficult to uniformly turn on an output transistor having large device dimensions, a gate-coupling technique, which is described in the last cited reference above, has been used to improve uniform turn-on behavior.

To summarize, having to use a CMOS output buffer of large device dimensions has two important disadvantages. One is the requirement of larger layout area, and the other is that the non-uniform turn-on behavior results in weaker ESD reliability. The present invention provides a novel solution which avoids these two disadvantages.

From a study of ESD protection circuits, it is apparent that an SCR device provides the highest ESD protection robustness in the smallest layout area. The SCR device has been successfully implemented as an ESD-protection element in CMOS IC's. Some typical references describing the use of an SCR device as ESD-protection element include the following:

A. Chatterjee and T. Polgreen, "A low-voltage triggering SCR for on-chip ESD protection at output and input pads," *IEEE Electron Devices Letters*, vol. 12, pp. 21–22, 1991.

M. -D. Ker, et al., "Area-efficient CMOS output buffer with enhanced high ESD reliability for deep submicron CMOS ASIC," *Proc.of IEEE International ASIC Conference and Exhibit*, pp. 123–126, 1995.

M. -D. Ker, et al., "ESD protection for deep-submicron CMOS technology using gate-couple CMO-Strigger lateral SCR structure," *Technical Digest of IEEE International Electron Devices Meeting*, pp. 543–546, 1995.

In the first two of these three references, the triggering of lateral SCR device is controlled by the drain breakdown of short-channel PMOS or NMOS devices. For output ESD protection, a typical circuit, which is shown in FIG. 2, uses a PTLSCR (PMOS-Trigger Lateral SCR) device to protect the output PMOS device, and an NTLSCR (NMOS-Trigger Lateral SCR) device to protect the output NMOS device. In the third reference, the device behavior of PTLSCR and NTLSCR is more clearly explained. It also shows that the PTLSCR and NTLSCR devices can be further controlled by applying voltage to the gates of PMOS and NMOS, which are inserted into the PTLSCR and NTLSCR structures.

This invention fully uses the natural advantages of the SCR device to work as both an output device and an ESD-protection device.

SUMMARY OF THE INVENTION

The invention is a novel implementation of an output buffer in a CMOS IC which uses CMOS-controlled lateral SCR devices. The lateral SCR device, which exists parasitically in CMOS IC's, is first used as an active device to perform an output driving/sinking function just as the CMOS output buffer does. Because the SCR device has excellent power delivery, it has been widely used as a power switch to turn on/off power to industrial products. An SCR with small device dimensions can deliver a high driving current. Moreover, the SCR device can provide the highest ESD protection capability for CMOS IC's, as compared to other ESD-protection devices that are typically used in CMOS IC's. Since the CMOS output buffer is directly connected to the output pad, the output buffer is directly stressed by an external ESD voltage. Thus, ESD reliability is an important issue on CMOS IC's.

In this invention, the lateral SCR device is used as a partially active component of the output buffer to improve the output driving/sinking capability within a smaller layout area, and to provide highly reliable, ESD protection for the CMOS output buffer. With the natural advantages of SCR device, this invention provides the CMOS output buffer with high-driving capability and highly robust ESD protection, all within a smaller chip layout area than is required for alternative techniques.

In general, in one aspect, the invention is an MOS-controlled, lateral SCR device including a semiconductor substrate of a first doping type; a first well region formed in the substrate and being of a second doping type which is different from the first doping type; a second well region formed in the substrate, being of the second doping type, and being spaced apart from the first well region so as to define an intermediate region separating the first and second well regions from each other; a first region formed within the first well region and extending into the intermediate region between the first and second well regions, the first region being of the second doping type; a second region formed within the second well region and extending into the intermediate region between the first and second well regions, said second region being of the second doping type; and a control gate bridging over the intermediate region between the first and second regions.

In preferred embodiments, the MOS-controlled, lateral SCR device further includes a third region formed in the substrate on a side of the second well region that is remote from the first well region, the third region being of the first doping type; and a fourth region formed in the first well region on a side of the first region that is remote from the second well region, the fourth region being of the second doping type. The first and second well regions and the first, second, third, and fourth regions are formed by diffusion. The first doping type is p-type and the second doping type is n-type. The MOS-controlled, lateral SCR device further includes a first conductor electrically connected to both the second and fourth regions and a second conductor electrically connected to both the first and third regions. The first and second regions have higher doping levels than the first and second well regions.

Also in preferred embodiments, the first doping type is n-type and the second doping type is p-type and the first and second regions have higher doping levels than the first and second well regions.

In general, in another aspect, the invention is an output buffer in a CMOS circuit. The output buffer includes an output pad; a VDD line which supplies a first supply voltage; a VSS line which supplies a second supply voltage; a first MOS device connected between the VDD line and the output pad; a second MOS device connected between the VSS line and the output pad; and an MOS-controlled, lateral SCR device connected from the output pad to one of the VDD and VSS lines and in parallel with one of the first and second MOS devices.

Preferred embodiments include the following features. The first MOS device is a PMOS device and the second MOS device is an NMOS device. The MOS-controlled, lateral SCR device is an NMOS-controlled, lateral SCR device and is connected between the VSS line and the output pad and in parallel with the NMOS device. Alternatively, the MOS-controlled, lateral SCR device is an NMOS-controlled, lateral SCR device and is connected between the VDD line and the output pad and in parallel with the PMOS device. In the latter case, the output buffer further includes an inverter connected between and gate electrode of the NMOS-controlled, lateral SCR device and the gate electrode of the PMOS device.

Also, in preferred embodiments, the MOS-controlled, lateral SCR device is a PMOS-controlled, lateral SCR device and is connected between the VDD line and the output pad and in parallel with the PMOS device. Or alternatively, the MOS-controlled, lateral SCR device is a PMOS-controlled, lateral SCR device and is connected between the VSS line and the output pad and in parallel with the NMOS device. In the latter case, the output buffer further includes an inverter connected between and gate electrode of the PMOS-controlled, lateral SCR device and the gate electrode of the NMOS device.

Also in preferred embodiments, the output buffer further includes a second MOS-controlled, lateral SCR device connected from the output pad to the VSS line and in parallel with the second MOS device and wherein the first-mentioned MOS-controlled, lateral SCR device is connected from the output pad to the VDD line and in parallel with the first MOS device. The first MOS device is a PMOS device and the second MOS device is an NMOS device. Both MOS-controlled, lateral SCR devices are NMOS-controlled, lateral SCR devices and the output buffer further includes an inverter connected between and gate electrode of the first-mentioned MOS-controlled, lateral SCR device and the gate electrode of the PMOS device. Alternatively, both MOS-controlled, lateral SCR devices are PMOS-controlled, lateral SCR devices and the output buffer further includes an inverter connected between and gate electrode of the first-mentioned MOS-controlled, lateral SCR device and the gate electrode of the NMOS device.

The invention performs high speed pull-up and pull-down functions for CMOS output buffers. It protects the CMOS output buffers against ESD stresses. And, it achieves both of these advantages within a smaller layout area than is typically possible in the prior art.

Other advantages and features will become apparent from the following description of the preferred embodiment and from the claims.

BRIEF DESCRIPTION OF THE DRAWINGS

FIGS. 5(a–b) show the device behavior of the NCLSCR device;

DESCRIPTION OF THE PREFERRED EMBODIMENTS

The important devices of this invention are a PCLSCR (PMOS-Controlled Lateral SCR) and an NCLSCR (NMOS-Controlled Lateral SCR). In the n-well/p-substrate CMOS process, the NCLSCR is used as output device to drive/sink current to/from the output node. In the p-well/n-substrate CMOS process, the PCLSCR is used as output device to drive/sink current to/from the output node.

The NCLSCR Device and its Applications

Circuit Configuration

Figure 1A:
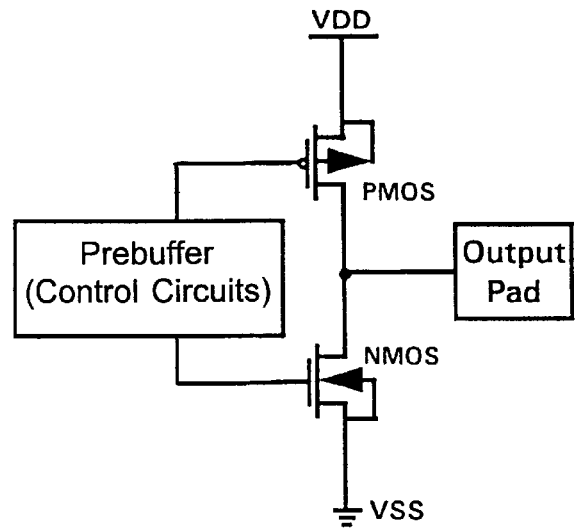
FIGS. 1(a–c) show several conventional CMOS output buffer designs.
Figure 1B:
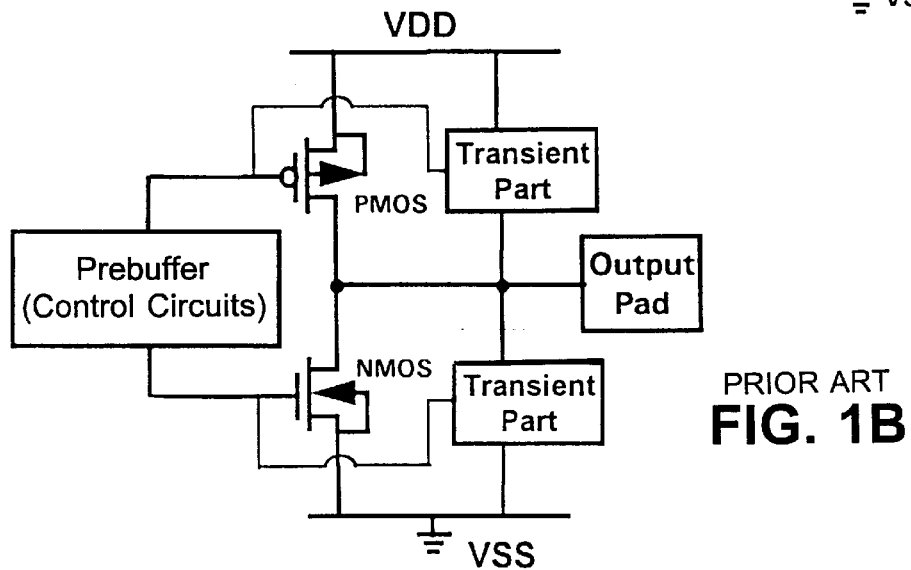
Figure 1C:
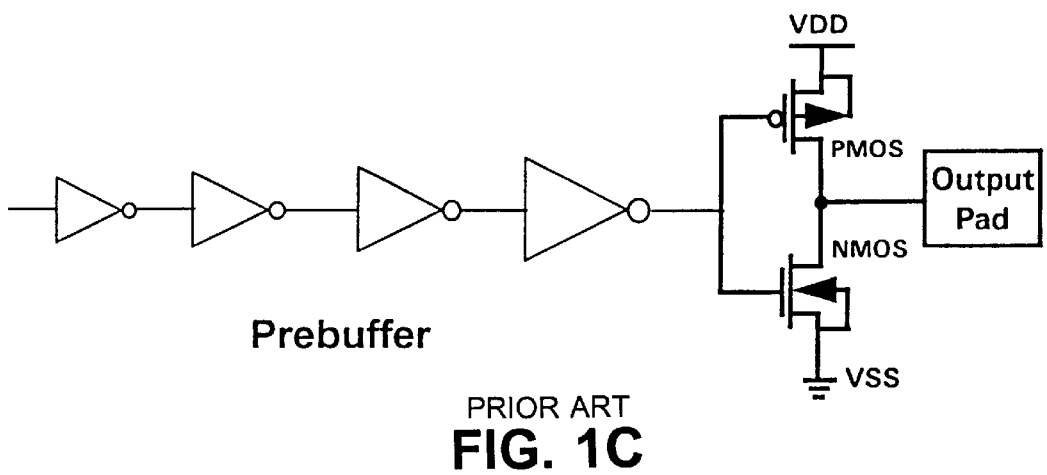
Figure 2:
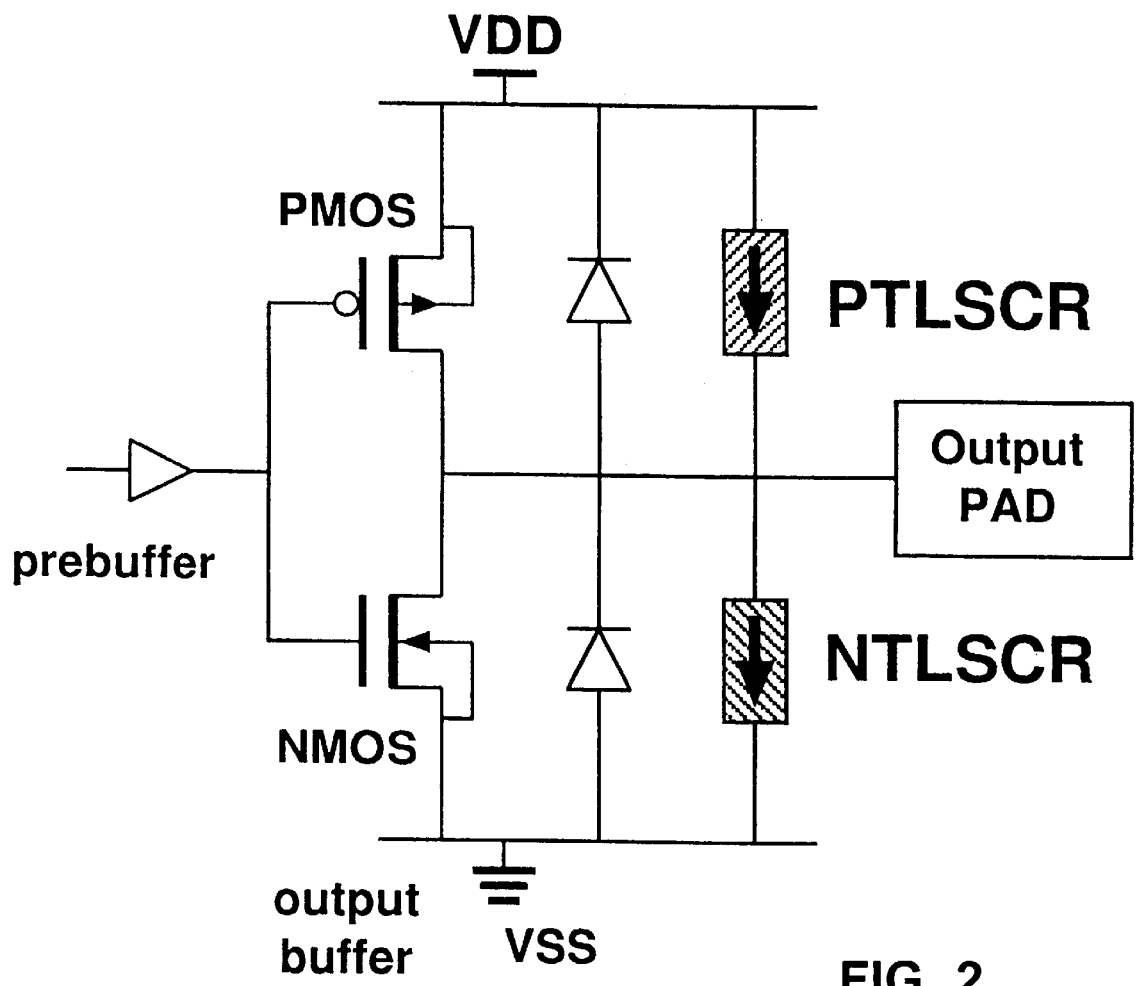
FIG. 2 shows a CMOS output buffer with enhanced ESD protection capability.
Figure 3:
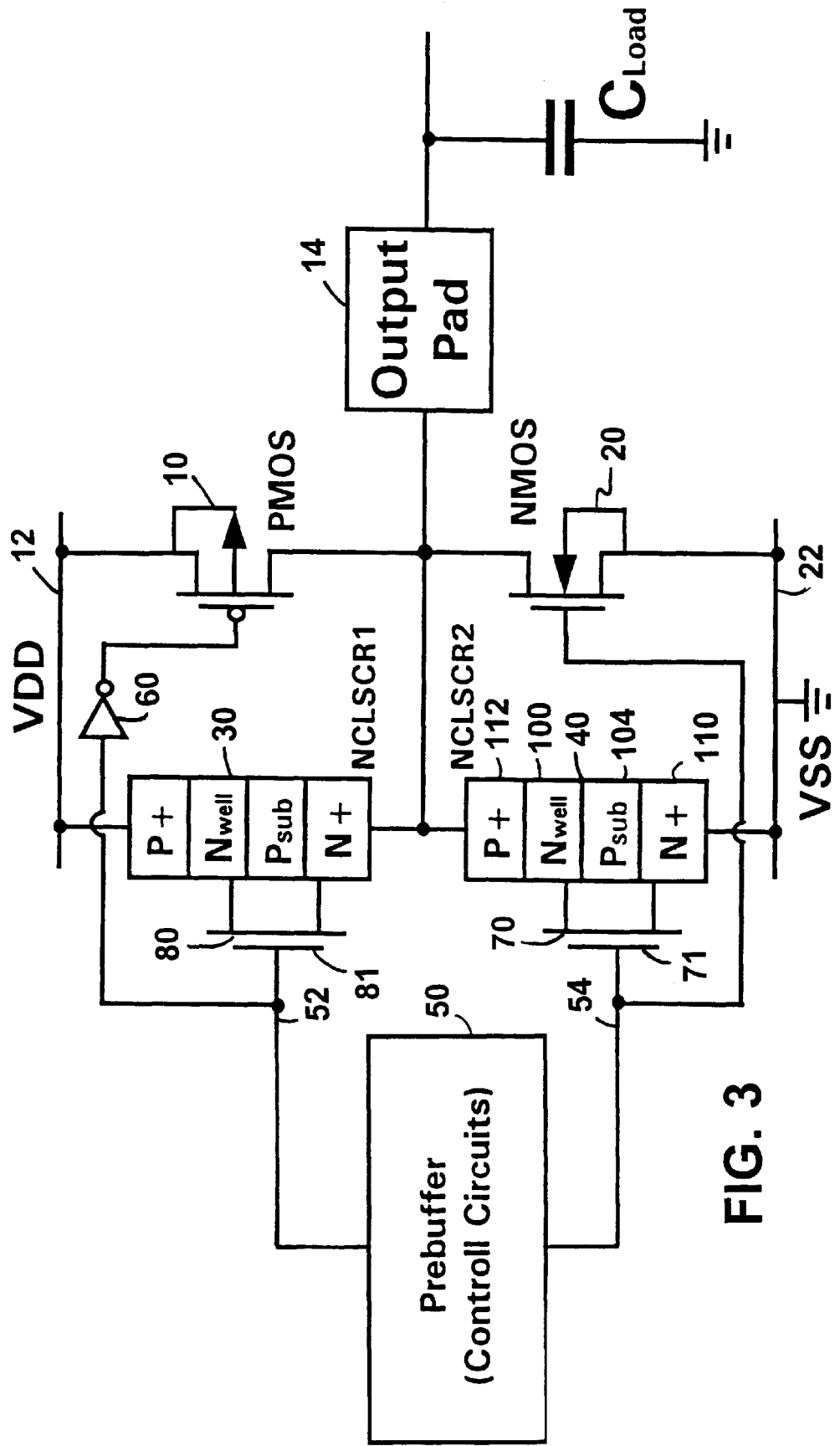
FIG. 3 shows a CMOS output buffer with NMOS-controlled lateral SCR (NCLSCR) devices that is fabricated using a P-substrate/N-well CMOS process.

A typical application of an NCLSCR device in a CMOS output buffer is shown in FIG. 3. The CMOS output buffer includes a PMOS device 10 connected between a VDD line 12 and an output pad 14 and an NMOS device 20 connected between a VSS line 22 and the output pad 14. As previously indicated, when supplied with the appropriate control signal to their gates, PMOS 10 performs a pull-up operation and NMOS 20 performs the pull-down operation. In this embodiment, one NCLSCR device 30 (NCLSCR1) is connected between the VDD line 12 and the output pad 14 and in parallel with PMOS 10, and another NCLSCR device 40 (NCLSCR2) is connected between output pad 14 and the VSS line 22 and in parallel with NMOS 20. Also, a prebuffer 50 (e.g. a group of internal control circuits) is used to provide the correct control signals to turn on and turn off NCLSCR1, NCLSCR2, PMOS 10 and NMOS 20. Prebuffer 50 includes one output line 52 which is connected to the gate of NCLSCR1 and to the gate of PMOS 10 through an inverter 60 and it includes a second output line 54 that is connected to the gates of both NCLSCR2 and NMOS 20.

Figure 4:
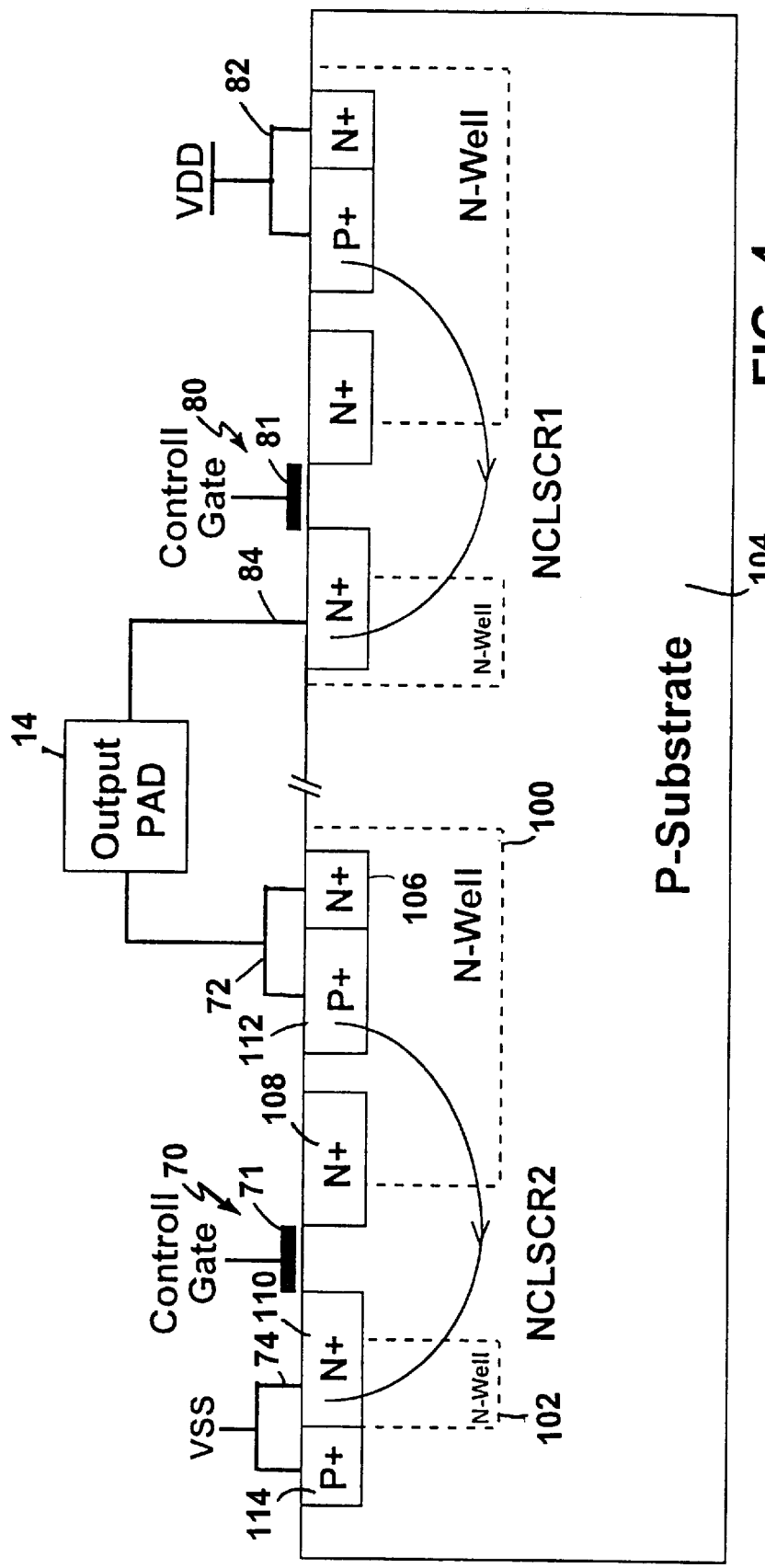
FIG. 4 shows a cross-sectional view of the NMOS-controlled lateral SCR (NCLSCR) devices which are fabricated using a P-substrate/N-well CMOS process.

A cross-sectional view of the combination of NCLSCR1 and NCLSCR2 is shown in FIG. 4, where they are implemented using the n-well/p-substrate CMOS process. NCLSCR1 and NCLSCR2 are made by inserting thin oxide NMOS devices 70 and 80, respectively, into the lateral SCR structures, as shown in FIG. 4. NCLSCR1 (also NCLSCR2) has an anode 82 (72), a cathode 84 (74), and a control gate 80 (70).

NCLSCR2 is formed by two laterally spaced apart n-well regions 100 and 102 in a p-type substrate 104. There are also three n$^+$-type regions 106, 108, and 110 and two p$^+$-type regions 112 and 114 which form the SCR portion of the device. The n$^+$-type region 106, which facilitates electrical contact to the n-well region 100, is formed entirely within n-well region 100. The anode 72 is connected to the p$^+$-type region 112 which is formed within the n-well region 100. The cathode 74 is connected to the n$^+$-type region 110 which is formed in the n-well region 102 and extends laterally into the p-substrate region 104 between the two n-well regions 100 and 102. The other n$^+$-type region 108 is formed in the n-well region 100 and extends laterally into the p-substrate 104 toward the other n$^+$-type region 110. The two n$^+$-type regions 108 and 110 also act as the drain and source of the lateral NMOS device 70 and the channel of the NMOS is created in the p-substrate 104 between them. The control gate electrode 71 is formed on a thin oxide and bridges over the space separating the two n$^+$-type regions 108 and 110.

In the described embodiment, the n-well regions 100 and 102; the three n$^+$-type regions 106, 108, and 110; and the two p$^+$-type regions 112 and 114 are formed by diffusions into the substrate.

As should be readily apparent from FIG. 4, NCLSCR1 has the same structure as NCLSCR2. Both NCLSCR1 and NCLSCR2 are triggered on when the inserted thin-oxide NMOS is turned on. So, NCLSCR1 and NCLSCR2 can be controlled by the voltage applied to their control gates 81 and 71.

Typical measured I–V curves of an NCLSCR device are shown in FIG. 5(a), where the positive voltage on the control gate leads to lower trigger voltage of the lateral SCR device. The dependence of this relation between the gate voltage and trigger voltage of NCLSCR is shown in FIG. 5(b). As gate voltage increases greater than 1.2V, the trigger voltage of the NCLSCR is lowered to below 2V. So, in the 5-V CMOS IC's, this NCLSCR can be fully turned on to conduct high current. In FIG. 5(a), the holding voltage of NCLSCR is about 1V. This NCLSCR will be automatically off if the voltage across its anode and cathode is below its holding voltage (about 1V). This is the normal behavior of the SCR device. So, in FIG. 3, there is an NMOS 20 of small device dimension placed in parallel with the NCLSCR2 to continually pull down the output voltage to VSS. Similarly, there is a PMOS 10 of small device dimension placed in parallel with NCLSCR1 to continually pull up output voltage to VDD.

Principles of Operation

Pull-up Operation:

Referring to FIG. 3, we assume that the initial voltage on the output pad is 0V, which is stored in the load capacitor, Cload. To pull up the output node, a positive (5-V) voltage is applied to the control gate 81 of NCLSCR1, a 0-V is applied to the gate of the output PMOS 10 because of inverter 60, and a 0-V voltage is applied to both the control gate 71 of NCLSCR2 and the gate of the output NMOS 20. In the described embodiment, the supply voltages on the VDD and VSS lines 12 and 22 which bias the devices are 5-V and 0-V, respectively. When the 5-V voltage is applied to the control gate of NCLSCR1, NCLSCR1 turns on to conduct current from the VDD supply line to the output node 14, and the output capacitor, Cload, charges up towards 4V. At the same time, the output PMOS also turns on because the gate of the PMOS is biased at 0V due to the inverter 60 connected between the gate of NCLSCR1 and the gate of PMOS. In contrast, both NCLSCR2 and the output NMOS are kept off during this pull-up operation. As the output voltage is pulled up to about 4V, NCLSCR1 will turn off due to the voltage across NCLSCR1 becoming less than its holding voltage. Then, the output voltage will be pulled up further (i.e., to 5V) by the output PMOS. In other words, NCLSCR1 functions so as to provide a large transient conduction current which operates to quickly pull up the output voltage. Because the logic threshold of CMOS IC's is about 2.5V (i.e., VDD/2), the logic function can be quickly transferred to the output node by NCLSCR1. The output PMOS works to pull up the output node the rest of the way to compete the full 5V swing.

Pull-down Operation:

Referring to FIG. 3, we now assume that the voltage on the output pad is 5V, which is again stored in the load capacitor, Cload. To pull down the output node, a 0-V voltage is applied to the control gate 81 of NCLSCR1 and a 5-V voltage is applied to the control gate 71 of NCLSCR2. When the 5-V voltage is applied to the control gate of NCLSCR2, it turns on to conduct current from the output node to the VSS supply line. The capacitor, Cload, is thus discharged. At the same time, because the gate of the output NMOS is also initially biased at 5V, the output NMOS also turns on. Both NCLSCR1 and the output PMOS are kept off during this pull-down operation. As the output voltage is pulled low to about 1V, NCLSCR2 will turn off due to the voltage across NCLSCR2 becoming less than its holding voltage. Then, the output voltage is discharged the final way to 0V by the output NMOS. Thus, NCLSCR2 functions to provide a large transient conduction current to quickly pull down the output voltage. Because the logic threshold of CMOS IC's is about 2.5V (VDD/2), the logic function can be quickly transferred to output node by NCLSCR2. The output NMOS works to pull down the output node the rest of the way to 0V.

ESD-stress condition

When a positive ESD voltage occurs on the output pad with a relatively grounded VSS, this positive ESD voltage will trigger on NCLSCR2 to bypass the ESD current. Similarly, when a negative ESD voltage occurs on the output pad with a relatively grounded VDD, this negative ESD voltage will trigger on NCLSCR1 to bypass ESD current. Both NCLSCR2 and NCLSCR1 provide highly robust ESD protection of the output pad.

Further details about operation of ESD protection can be found in M. -D. Ker, et al., "Area-efficient CMOS output buffer with enhanced high ESD reliability for deep submicron CMOS ASIC," *Proc. of IEEE International ASIC Conference and Exhibit*, pp. 123–126, 1995, which describes two lateral SCR devices that are used to perform effective ESD protection for the output pad.

Other Applications

Figure 6:
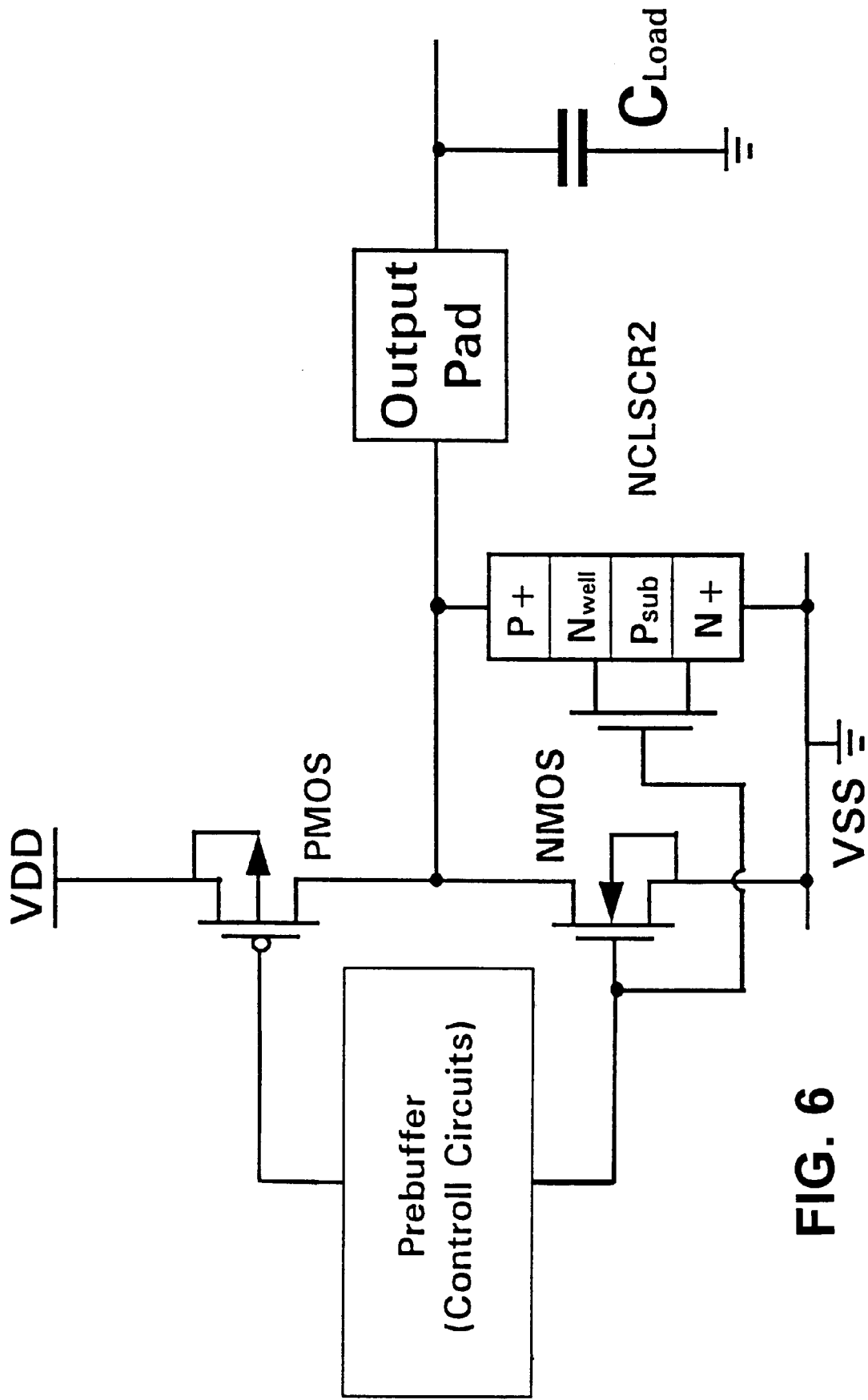
FIG. 6 shows one version of a CMOS output buffer which uses a single NMOS-controlled lateral SCR (NCLSCR) device.
Figure 7:
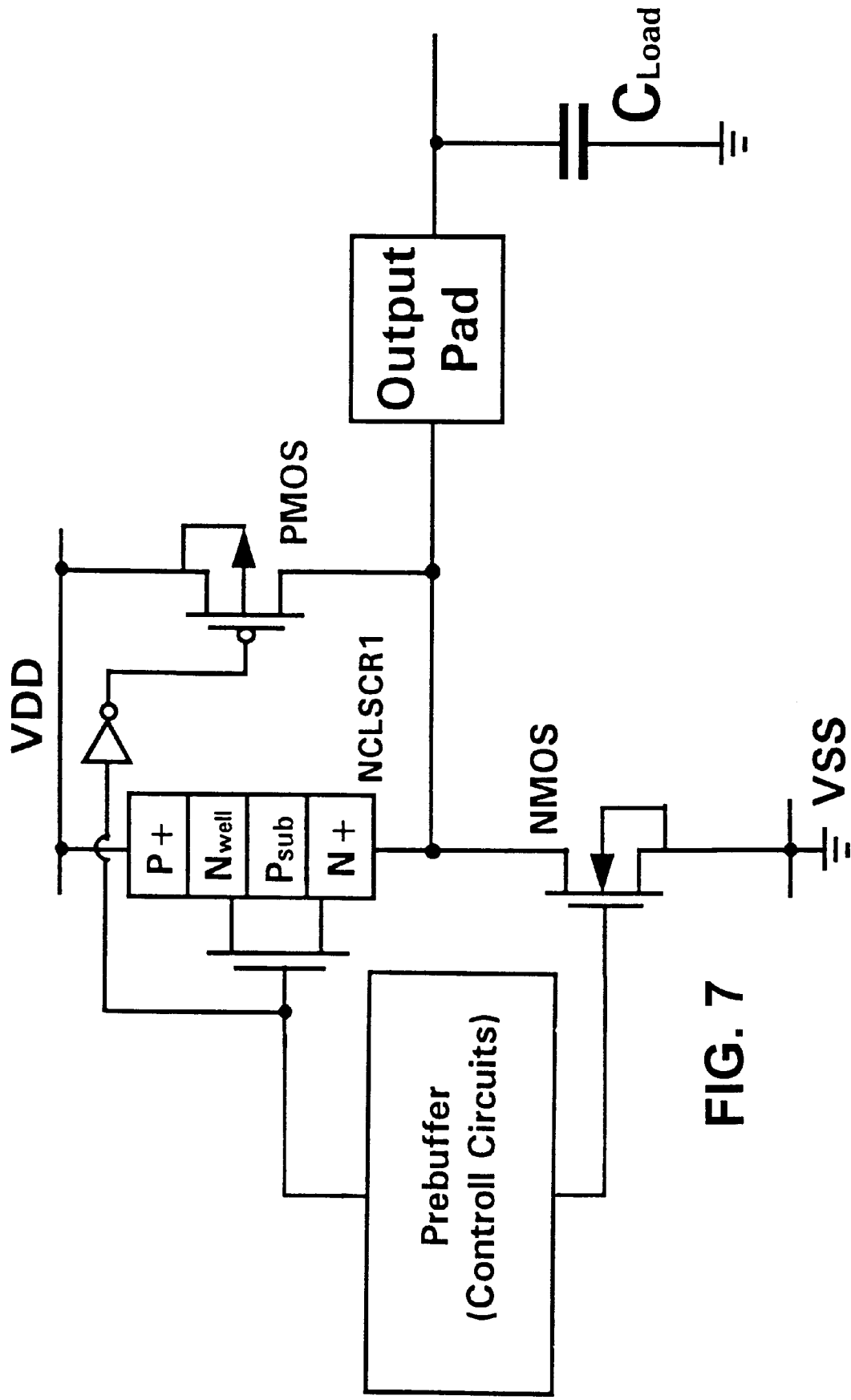
FIG. 7 shows another version of a CMOS output buffer which also uses a single NMOS-controlled lateral SCR (NCLSCR) device.

The NCLSCR device can be used to only enhance the pull-up or the pull-down speed of the output buffer. For example, FIG. 6 shows using only a single NCLSCR device to enhance the pull-down speed of the CMOS output buffer and FIG. 7 shows using a single NCLSCR device to enhance only the pull-up speed of the CMOS output buffer.

The PCLSCR and its Applications

Circuit Configuration

Figure 8:
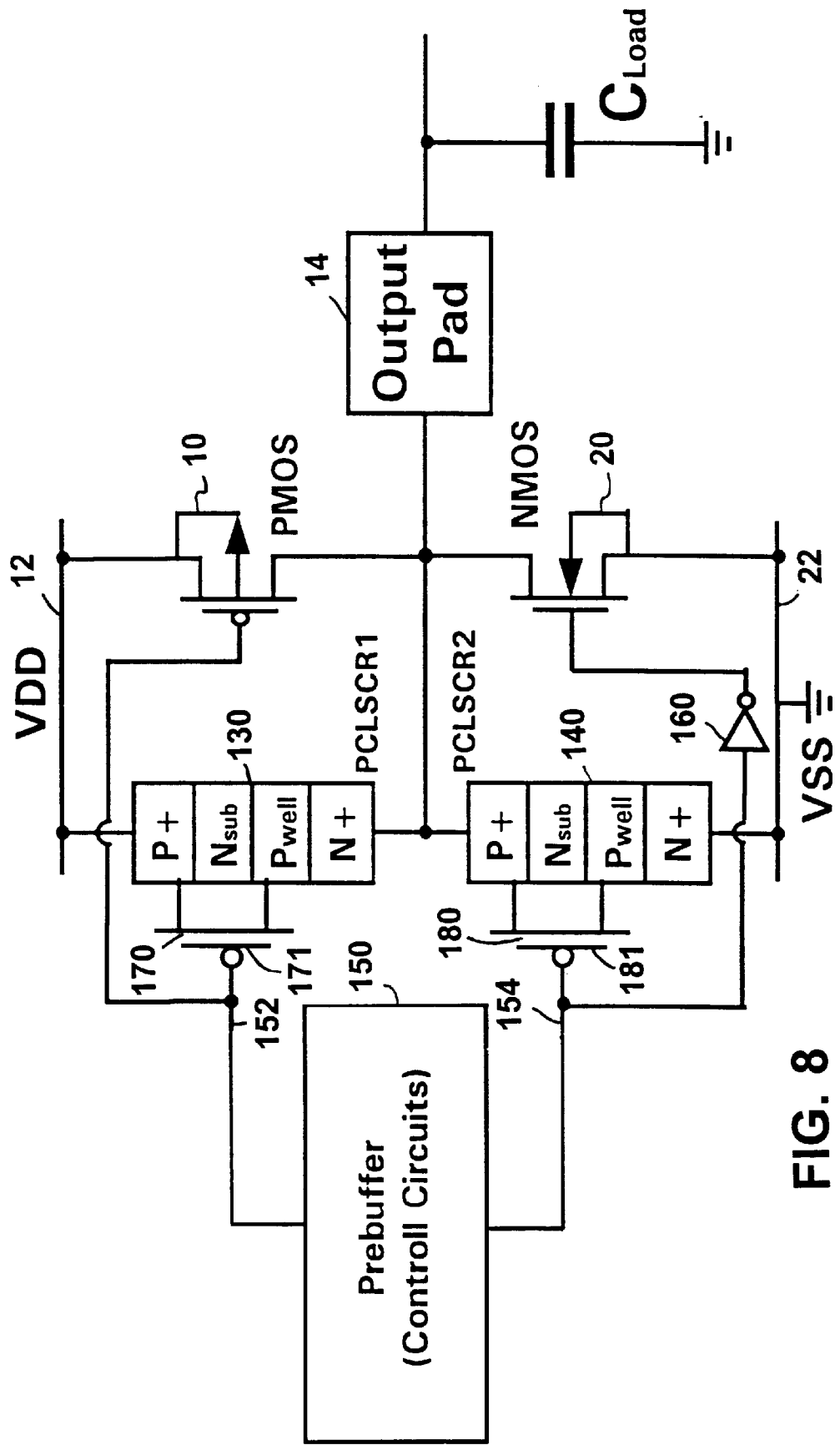
FIG. 8 shows a CMOS output buffer with PMOS-controlled lateral SCR (PCLSCR) devices that is fabricated using an N-substrate/P-well CMOS process.

A typical application of a PCLSCR in a CMOS output buffer is shown in FIG. 8. As was the case for FIG. 3, the CMOS output buffer includes a PMOS device 10 connected between a VDD line 12 and an output pad 14 and an NMOS device 20 connected between a VSS line 22 and the output pad 14. In this embodiment, one PCLSCR device 130 (i.e., PCLSCR1) is connected between the VDD line 12 and the output pad 14 and in parallel with PMOS 10, and another PCLSCR device 140 (i.e., PCLSCR2) is connected between the output pad 14 and the VSS line 22 and in parallel with NMOS 20. A prebuffer 150 (e.g. a group of internal control circuits) is used to provide the correct control signals to turn on and turn off PCLSCR1 and PCLSCR2. Prebuffer 150 includes one output line 152 which is connected to the gates of both PCLSCR1 and PMOS 10 and it includes a second output line 154 that is connected to the gate of PCLSCR2 and to the gate of NMOS 10 through an inverter 160.

Figure 9:
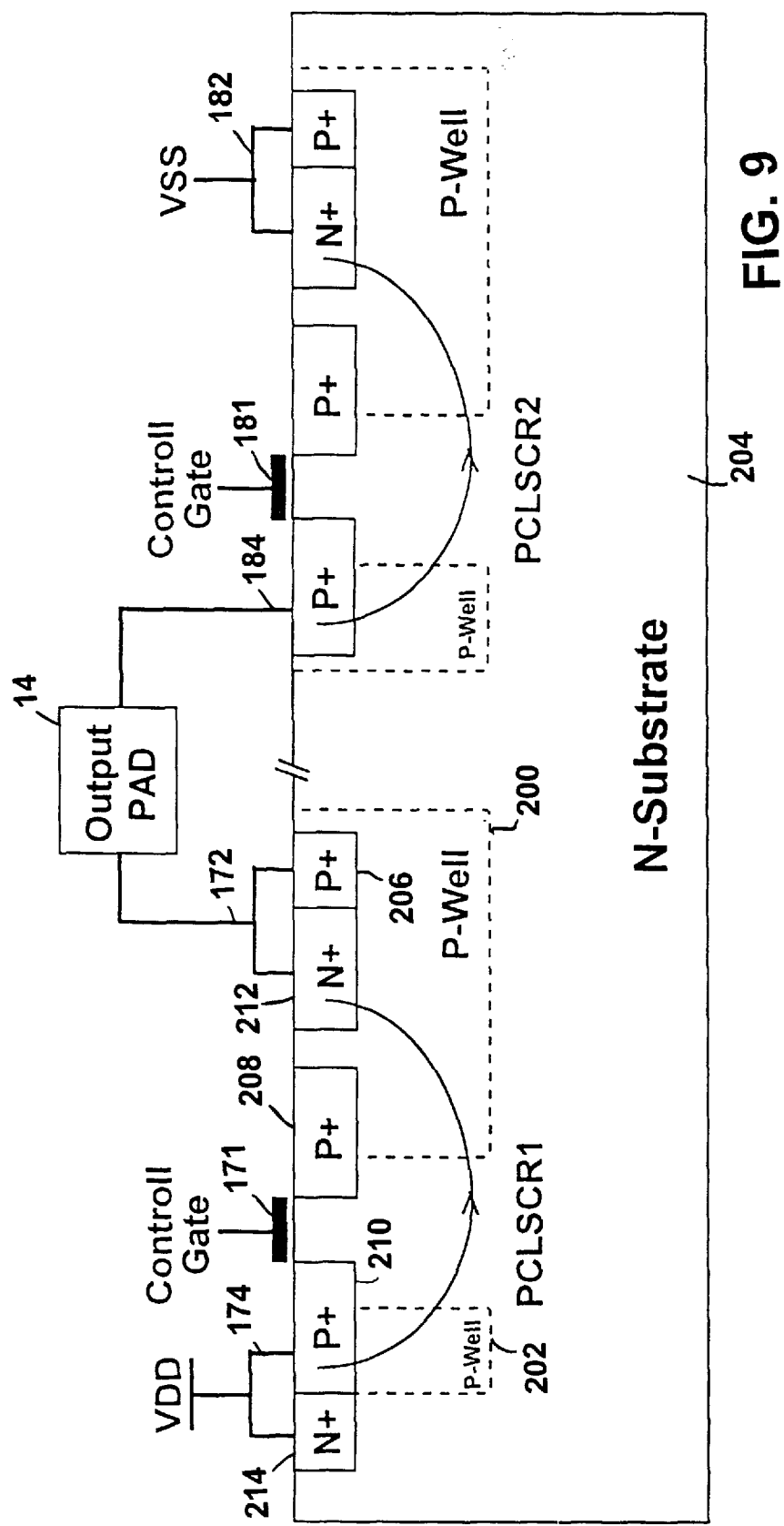
FIG. 9 shows a cross-sectional view of the PMOS-controlled lateral SCR (PCLSCR) device which are fabricated using an N-substrate/P-well CMOS process.

A cross-sectional view of PCLSCR1 and PCLSCR2 is shown in FIG. 9, where they are implemented using a p-well/n-substrate CMOS process. PCLSCR1 and PCLSCR2 are made by inserting thin-oxide PMOS devices 180 and 170 into the lateral SCR structures, as shown in FIG. 9. PCLSCR1 (also and PCLSCR2) has an anode 174 (184), a cathode 172 (182), and a control gate 171 (181).

PCLSCR1 is formed by two laterally spaced apart p-well regions 200 and 202 in a n-type substrate 204. There are also three p$^+$-type regions 206, 208, and 210 and two n$^+$-type regions 212 and 214 which form the SCR portion of the device. The p$^+$-type region 206, which facilitates electrical contact to the p-well region 200, is formed entirely within p-well region 200. The cathode 172 is connected to the n$^+$-type region 212 which is formed within the p-well region 200. The anode 174 is connected to the p$^+$-type region 210 which is formed in the p-well region 202 and extends laterally into the n-substrate region 204 between the two p-well regions 200 and 202. The other p$^+$-type region 208 is formed in the p-well region 200 and extends laterally into the n-substrate 204 toward the other p$^+$-type region 210. The two p$^+$-type regions 208 and 210 also act as the drain and source of the lateral PMOS device 170 and the channel of the PMOS is created in the n-substrate 204 between them. The control gate electrode 171 is formed on a thin oxide and bridges over the region separating the two p$^+$-type regions 208 and 210.

In the described embodiment, the p-well regions 200 and 202; the three p$^+$-type regions 206, 208, and 210; and the two n$^+$-type regions 212 and 214 are formed by diffusions into the substrate.

As should be readily apparent from FIG. 9, PCLSCR2 has the same structure as PCLSCR1. Both PCLSCR1 and PCLSCR2 are triggered on, if the inserted thin-oxide PMOS is turned on. So, PCLSCR1 and PCLSCR2 can be controlled by the voltages applied to the control gates 171 and 181, respectively.

Figure 10B:
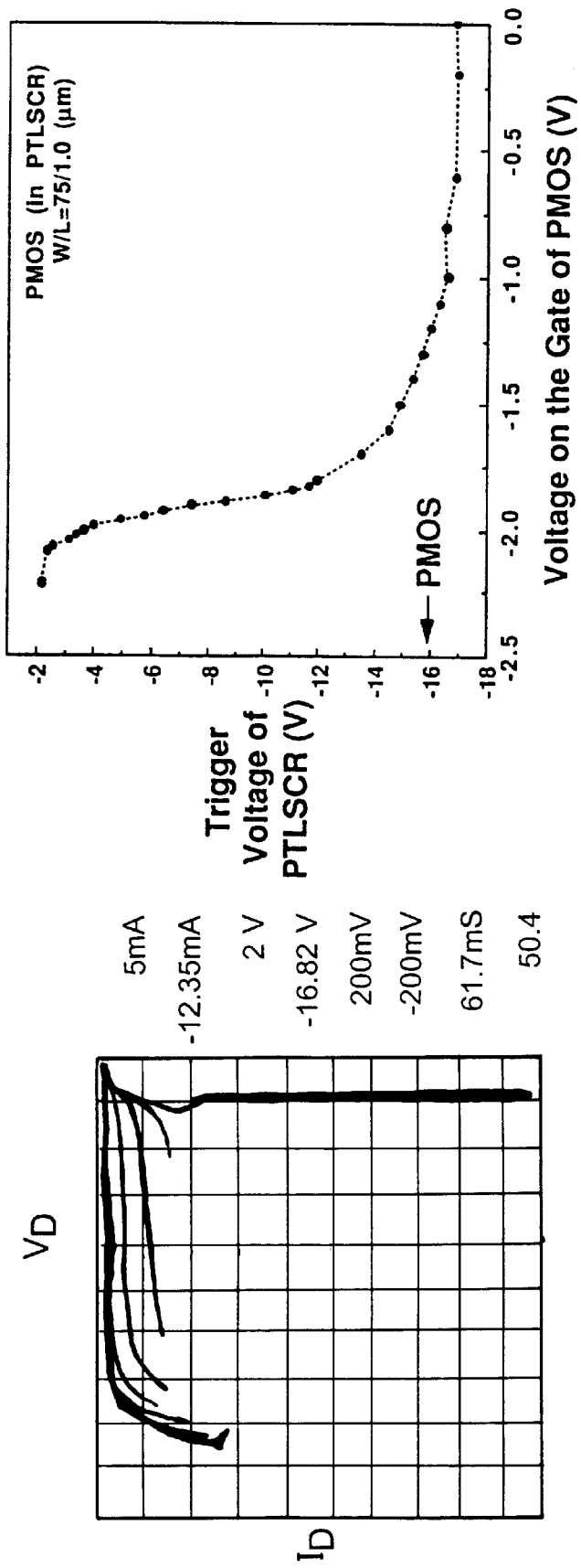
FIGS. 10(a–b) show the device behavior of the PCLSCR device.
Figure 10A:
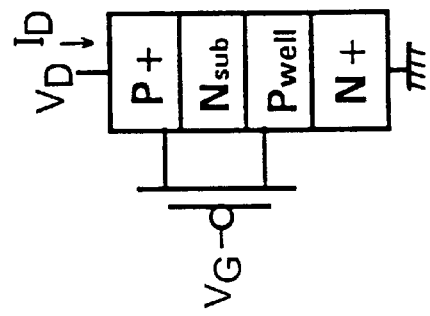

Typical measured I–V curves of a PCLSCR device are shown in FIG. 10(*a*), where the negative voltage on the control gate leads to smaller (in magnitude) trigger voltage of the lateral SCR device. The dependance of this relation between the gate voltage and trigger voltage of the PCLSCR device is shown in FIG. 10(*b*). As the gate voltage (Vgs) decreases to less than about −2V, the trigger voltage (Vds) of the PCLSCR device is lowered to below −2V. So, in 5-V CMOS IC's, this PCLSCR device can be fully turned on to conduct a high current. As indicated in FIG. 10(*a*), the holding voltage of the PCLSCR device is about −1V. Thus, the PCLSCR device automatically turn off if the voltage across its anode and cathode falls below this holding voltage (i.e., about 1V). This is the normal behavior of an SCR device.

As indicated in FIG. 8, a small dimensioned NMOS is placed in parallel with PCLSCR2 to continually pull down the output voltage to VSS. Similarly, a small dimensioned PMOS device is placed in parallel with PCLSCR1 to continually pull up the output voltage to VDD.

Principles of Operation

Pull-up Operation:

Referring to FIG. 8, we assume that the initial voltage on the output pad is 0V, which is stored in the load capacitor, Cload. To pull up the output node, a 0-V voltage is applied to the control gate of PCLSCR1 and a 5-V voltage is applied to the control gate of PCLSCR2. Again, the supply voltages on the VDD line and the VSS line are 5-V and 0-V, respectively. When the 0-V voltage is applied to the control gate of PCLSCR1, PCLSCR1 turns on to conduct current from the VDD line to the output node and the load capacitor, Cload, charges up. PCLSCR2 and the output NMOS are kept off in the pull-up condition. At the same time, because the gate of the output PMOS is also biased at 0V, the output PMOS also turns on. As the output voltage is pulled up to about 4V, PCLSCR1 will turn off because the voltage across PCLSCR1 will become less than its holding voltage. Then, the output voltage will be pulled up further (i.e., to 5V) by the output PMOS. In this case, PCLSCR1 functions so as to provide a large transient conduction current to quickly pull up the output voltage. Because the logic threshold of CMOS IC's is about 2.5V (VDD/2), the logic function can be quickly transferred to the output node by PCLSCR1. The output PMOS works, as before, to pull up the output node the rest of the way to complete the full 5V swing.

Pull-down Operation:

Again referring to FIG. 8, we now assume that the initial voltage on the output pad is 5V, which voltage is stored in the capacitor, Cload. To pull down the output node, a 5-V voltage is applied to the control gate of PCLSCR1 and a 0-V voltage is applied to the control gate of PCLSCR2. When the 0-V voltage is applied to the control gate of PCLSCR2, PCLSCR2 turns on to conduct current from the output node to the VSS line and load capacitor, Cload, discharges. At the same time, because the gate of NMOS is also biased at 5V due to the inverter connected between the gate of PCLSCR2 and the gate of output NMOS, the output NMOS also turns on. In this pull-down condition, PCLSCR1 and the output PMOS are kept off. As the output voltage is pulled low to about 1V, PCLSCR2 will turn off because the voltage across PCLSCR2 will fall to less than its holding voltage. Then, the output voltage will be discharged the rest of the way to 0V by the output NMOS. In other words, PCLSCR2 functions so as to provide a large transient conduction current to quickly pull down the output voltage. Because the logic threshold of CMOS IC's is about 2.5V (VDD/2), the logic function can be quickly transferred to output node by PCLSCR2. The output NMOS still works to finally pull down the output node to 0V.

ESD-stress condition:

When a positive ESD voltage occurs on the output pad with a relatively grounded VSS, this positive ESD voltage will trigger on PCLSCR2 to bypass the ESD current. Similarly, when a negative ESD voltage occurs on the output pad with a relatively grounded VDD, this negative ESD voltage will trigger on PCLSCR1 to bypass the ESD current. Both PCLSCR1 and PCLSCR2 provide excellent ESD protection for the CMOS output buffer within a small layout area.

Other Applications

Figure 11:
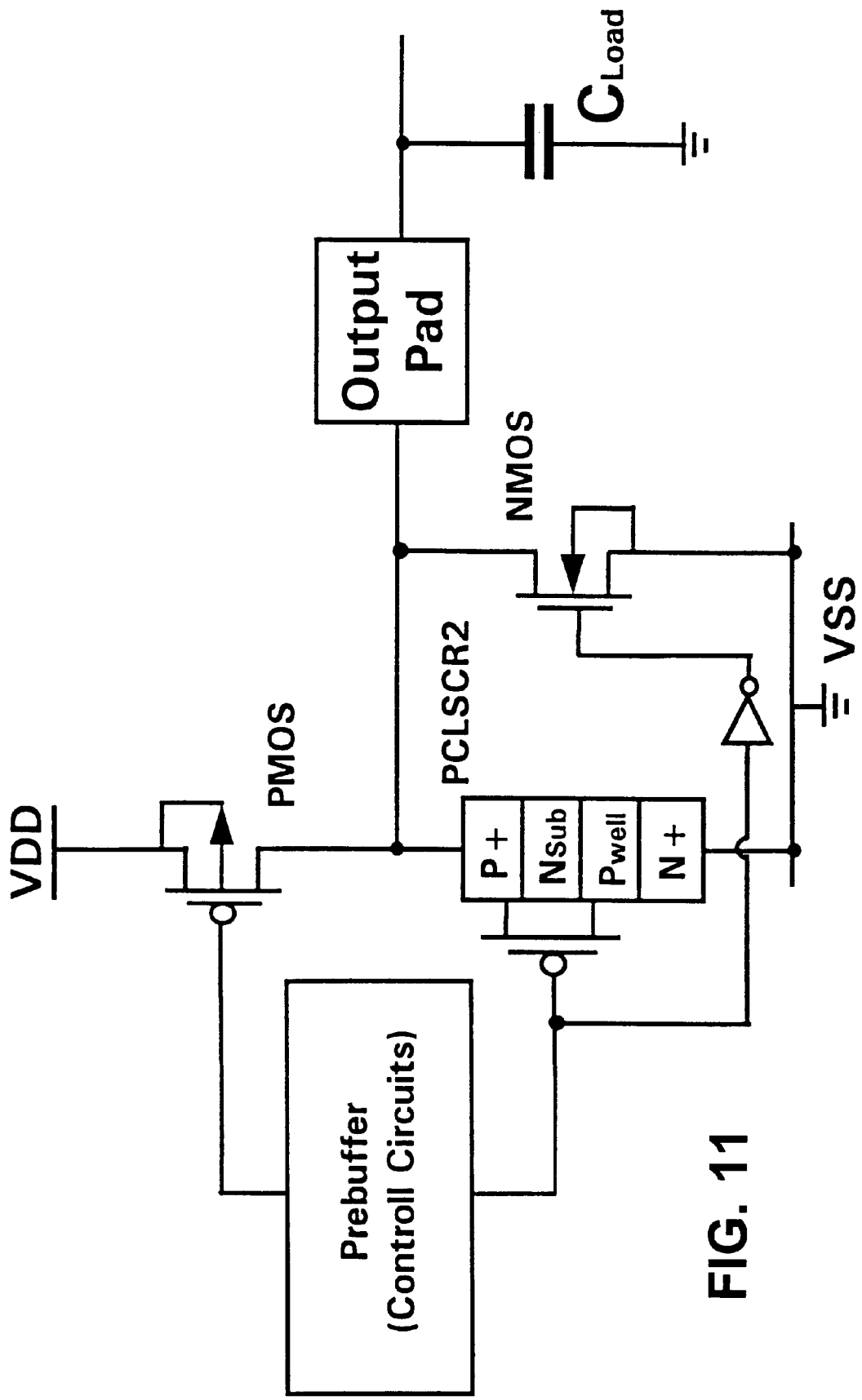
FIG. 11 shows one version of a CMOS output buffer which uses a single PMOS-controlled lateral SCR (PCLSCR) device.
Figure 12:
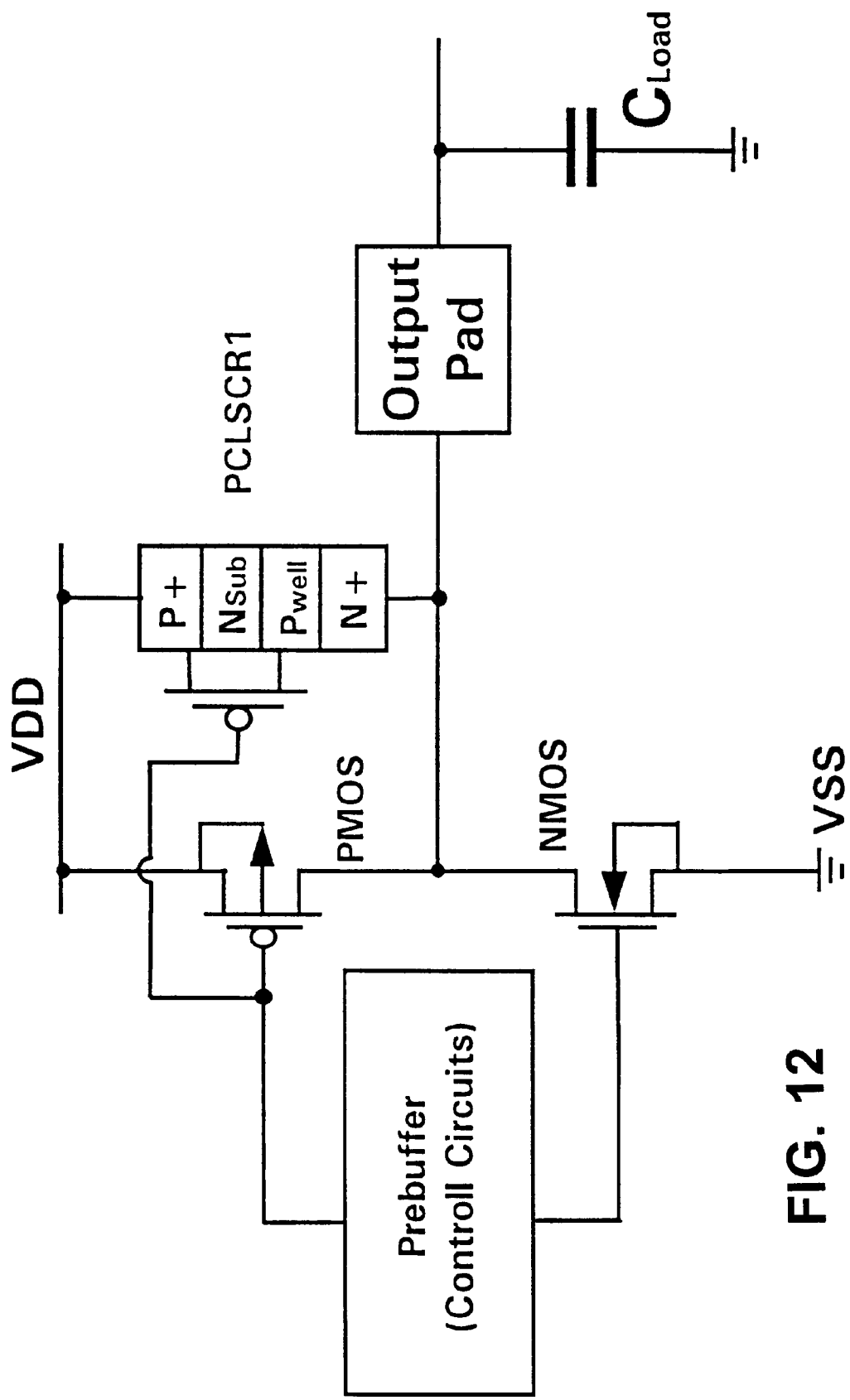
FIG. 12 shows another version of a CMOS output buffer which also uses a single PMOS-controlled lateral SCR (PCLSCR) device.

The PCLSCR device can be used to enhance only the pull-up or only the pull-down speed of output buffer. For example, FIG. 11 shows using only a single PCLSCR device to enhance the pull-down speed of the CMOS output buffer and FIG. 12 shows using only a single PCLSCR device to enhance the pull-up speed of the CMOS output buffer.

Layout Example

In a practical layout example of a CMOS output buffer with NCLSCR devices using a 0.6-um p-substrate CMOS process, the device dimensions are as follows:

the output PMOS in the layout is 38.4/1.0 ($\mu$m);

the NMOS which is inserted into NCLSCR1 is 60/1.0 ($\mu$m);

the output NMOS in the layout is 38.4/1.0 ($\mu$m);

the NMOS which inserted into NCLSCR2 is also 60/1.0 ($\mu$m); and in the inverter which performs the output control function for output PMOS, the PMOS, and the NMOS are all 8.4/1.0 ($\mu$m).

The total layout area of NCLSCR1, the output PMOS, the inverter PMOS, and a guard ring is only 113.7×53.8 $\mu m^2$, The total layout area of NCLSCR2, the output NMOS, the inverter NMOS, and a guard ring of a P+ diffusion is only 107.3×53.8 $\mu m^2$. Thus, this CMOS output buffer, which can perform both quick pull-up an pull-down and provide high reliability ESD protection, does so within a smaller layout area than is achievable in other prior art layouts. This makes the invention particularly useful in submicron or deep-submicron CMOS technologies.

Other embodiments are within the following claims.

What is claimed is:

1. An output buffer in a CMOS circuit, said output buffer comprising:

an output pad;

a VDD line to supply a first supply voltage;

a VSS line to supply a second supply voltage;

a first MOS device having a gate and being connected between the VDD line and the output pad;

a second MOS device having a gate and being connected between the VSS line and the output pad; and an MOS-controlled, lateral SCR device having a MOS-control gate and being connected from the output pad to one of the VDD and VSS lines in parallel with one of the first and second MOS devices, the SCR device and the one of the first and second MOS devices being arranged to conduct current in the same direction, the MOS-control gate and the gate of the one of the first and second MOS devices being electrically coupled.

2. The output buffer of claim 1 wherein the first MOS device is a PMOS device and wherein the second MOS device is an NMOS device.

3. The output buffer of claim 2 wherein the MOS-controlled, lateral SCR device is an NMOS-controlled, lateral SCR device and is connected between the VSS line and the output pad and in parallel with the NMOS device.

4. The output buffer of claim 2 wherein the MOS-controlled, lateral SCR device is an NMOS-controlled, lateral SCR device and is connected between the VDD line and the output pad and in parallel with the PMOS device.

5. The output buffer of claim 4 wherein the PMOS device and the NMOS-controlled, lateral SCR device both have a gate electrode and wherein the output buffer further comprises an inverter connected between and gate electrode of the NMOS-controlled, lateral SCR device and the gate electrode of the PMOS device.

6. The output buffer of claim 2 wherein the MOS-controlled, lateral SCR device is a PMOS-controlled, lateral SCR device and is connected between the VDD line and the output pad and in parallel with the PMOS device.

7. The output buffer of claim 2 wherein the MOS-controlled, lateral SCR device is a PMOS-controlled, lateral SCR device and is connected between the VSS line and the output pad and in parallel with the NMOS device.

8. The output buffer of claim 7 wherein the NMOS device and the PMOS-controlled, lateral SCR device both have a gate electrode and wherein the output buffer further comprises an inverter connected between and gate electrode of the PMOS-controlled, lateral SCR device and the gate electrode of the NMOS device.

9. The output buffer of claim 1 further comprising a second MOS-controlled, lateral SCR device connected from the output pad to the VSS line and in parallel with the second MOS device and wherein the first-mentioned MOS-controlled, lateral SCR device is connected from the output pad to the VDD line and in parallel with the first MOS device.

10. The output buffer of claim 9 wherein the first MOS device is a PMOS device and wherein the second MOS device is an NMOS device.

11. The output buffer of claim 10 wherein both MOS-controlled, lateral SCR devices are NMOS-controlled, lateral SCR devices.

12. The output buffer of claim 11 wherein the PMOS device and the first-mentioned MOS-controlled, lateral SCR device both have a gate electrode and wherein the output buffer further comprises an inverter connected between and gate electrode of the first-mentioned MOS-controlled, lateral SCR device and the gate electrode of the PMOS device.

13. The output buffer of claim 10 wherein both MOS-controlled, lateral SCR devices are PMOS-controlled, lateral SCR devices.

14. The output buffer of claim 13 wherein the NMOS device and the second MOS-controlled, lateral SCR device both have a gate electrode and wherein the output buffer further comprises an inverter connected between and gate electrode of the second MOS-controlled, lateral SCR device and the gate electrode of the NMOS device.

15. The output buffer of claim 1, further comprising:
    a semiconductor substrate; the first MOS device, the second MOS device, and the MOS-controlled, lateral SCR device being formed on the semiconductor substrate.

16. The output buffer of claim 9, further comprising:
    a semiconductor substrate; the first and second MOS-controlled lateral, SCR devices and the first and second MOS devices being formed on the semiconductor substrate.

* * * * *